United States Patent
Sato

(10) Patent No.: US 6,175,581 B1
(45) Date of Patent: Jan. 16, 2001

(54) DISTRIBUTED FEEDBACK SEMICONDUCTOR LASER

(75) Inventor: Kenji Sato, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/124,768

(22) Filed: Jul. 30, 1998

(30) Foreign Application Priority Data

Aug. 5, 1997 (JP) .................................................. 9-210847

(51) Int. Cl.[7] .................................................. H01S 5/00
(52) U.S. Cl. .................................................. 372/44; 372/96
(58) Field of Search .................................. 372/96, 50, 45, 372/102

(56) References Cited

U.S. PATENT DOCUMENTS

| | | | |
|---|---|---|---|
| 4,847,856 | * 7/1989 | Sugimura et al. | 372/96 |
| 4,847,857 | * 7/1989 | Ohkura | 372/96 |
| 5,170,402 | * 12/1992 | Ogita et al. | 372/50 |
| 5,185,759 | * 2/1993 | Matsuyama | 372/96 |
| 5,386,433 | * 1/1995 | Ohkura et al. | 372/96 |
| 5,926,497 | * 7/1999 | Nitta et al. | 372/96 |
| 5,936,994 | * 8/1999 | Hong et al. | 372/96 |

FOREIGN PATENT DOCUMENTS

| | | |
|---|---|---|
| 61-47685 | 3/1986 | (JP) . |
| 61-283192 | 12/1986 | (JP) . |
| 62-155584 | 7/1987 | (JP) . |
| 1-238181 | 9/1989 | (JP) . |
| 3-76291 | 4/1991 | (JP) . |
| 4-100287 | 4/1992 | (JP) . |
| 6338659 | 12/1994 | (JP) . |
| 7-335971 | 12/1995 | (JP) . |

* cited by examiner

*Primary Examiner*—Teresa M. Arroyo
*Assistant Examiner*—Quyen P. Leung
(74) *Attorney, Agent, or Firm*—Sughrue, Mion, Zinn Macpeak & Seas, PLLC

(57) ABSTRACT

In a semiconductor laser with a diffraction grating which carries out optical feedback, the diffraction grating has, at the center of the laser cavity, a phase-shift structure 5 of a half period of the basic grating period which is averaged over the whole grating. And in the central region of this grating, a section of period variation (a second grating 4 and a third grating 6) with different grating periods from the basic period is incorporated in such a manner as the amounts of variation from the basic period spread, from the center towards both facets of the laser cavity, with the equal absolute value but the reversed sign to each other. According to the semiconductor laser of the present invention, the longitudinal intensity distribution of electric field in the laser cavity is uniform. Therefore the laser does not show the variation in the ratio of the forward to the backward lasing output power even when the bias current is altered, and is easy to monitor the lasing output on the system.

19 Claims, 8 Drawing Sheets

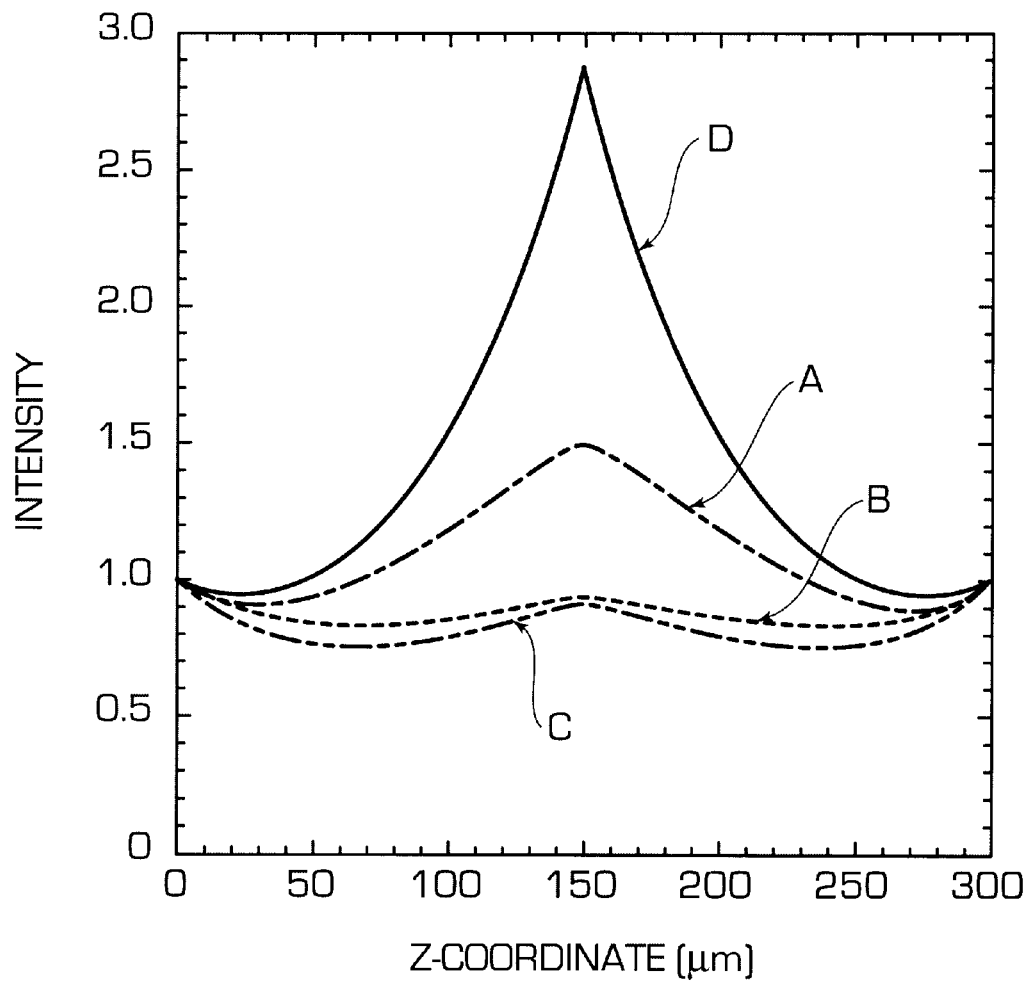

LONGITUDINAL COORDINATE (μm)

LASER CAVITY

LASER CAVITY

DISTRIBUTED FEEDBACK SEMICONDUCTOR LASER

BACKGROUND OF THE INVENTION

1. Field of the Invention

The present invention relates to a semiconductor laser and more particularly to a phase-shifted distributed feedback (DFB) semiconductor laser which is high in mode stability and utilized in a digital Optical transmission system.

2. Description of the Prior Art

In the conventional digital optical transmission system, a semiconductor laser called a $\lambda/4$ phase-shifted DFB semiconductor laser and high in a single-mode quality is utilized, wherein the phase of a diffraction grating is shifted by a half period at the center of a laser resonance cavity. The $\lambda/4$ phase-shift structure is a known structure and is described, for example, in "Semiconductor, Japan Society of Applied Physics(ed.), Ohmsha Ltd., 1994, pp. 272, FIG. 12—12".

A $\lambda/4$ phase-shifted DFB semiconductor laser has, as FIG. 5 shows a cross-sectional view thereof, a $\lambda/4$ phase-shift structure 45 by which the phase between a first grating 43 and a second grating 44 is shifted by a half period, at the center of the laser cavity. In such a structure, a side mode suppression ratio may be advantageously high, since the laser oscillation wavelength therein is equal to the Bragg wavelength $\lambda_B$, determined by the grating period $\Lambda$ thereof, that is $$\lambda_B 32\ 2\Lambda n_{eff}$$

where $n_{eff}$ is the effective refractive index.

However, this structure has a problem that the forward lasing output power cannot be monitored by the backward lasing output power (tracking error), because the ratio of the forward to the backward lasing output power varies with the bias current. Further, there is another problem that wavelength shifts at the time of modulation (chirping) are large so that code errors may be brought about in the long distance transmission. These problems arise from the fact that, because the $\lambda/4$ phase-shift structure is located at the center of the laser cavity, the electric field in this phase-shift region becomes very strong. And, as the bias current is increased, the non-uniformity of the distribution of the internal electric field extremely increases. The resulting fluctuation of carrier distribution causes the difference of the refractive index changes along locations in the laser cavity.

Further, there is another problem that the conversion efficiency of the output light against the input current is low, since it becomes difficult for the light to go out as the output power due to the concentration of the electric field in the central region of the laser cavity.

In Japanese Patent Application Laid-open No. 025086/1990, an example structure to solve the above problems is described, wherein, instead of positioning a $\lambda/4$ phase shift structure at the center of the laser cavity, as FIG. 6(A) shows across-sectional view thereof, a second diffraction grating 54, a period of which differs slightly from a period of a first grating 53 and a third grating 55, is set in a central region of about 100 $\mu$m of the cavity and thereby the phase between the gratings 53 and 55 in end sections is shifted by a total of $\lambda/4$. This structure is characterized by the flatter longitudinal intensity distribution of electric field in the cavity, in comparison with the $\lambda/4$ phase-shifted DFB semiconductor laser described above. However, in this structure, because grating periods are not constant within the cavity, the laser does not oscillate at Bragg wavelength, which causes a problem of a low stability in the lasing mode.

SUMMARY OF THE INVENTION

An object of the present invention is to provide a semiconductor laser which does not show the variations in the ratio of the forward to the backward lasing output power, even when the bias current is altered, by making the longitudinal intensity distribution of electric field in the laser cavity uniform and which is easy to monitor the lasing output power on the system. A further object of the present invention, by making the longitudinal intensity distribution of electric field in the laser cavity uniform, is to provide a semiconductor laser which shows less wavelength shift at the time of modulation, is capable of a stable operation even at the time of modulation and has a high conversion efficiency (output light against input current).

A further object of the present invention is to provide a semiconductor laser which can reduce rates of code errors at the time of digital modulation by raising the stability of the lasing mode, compared with the conventional semiconductor lasers.

A further object of the present invention is to provide a semiconductor laser which can be manufactured with reduced fluctuations of characteristics among lasers and therefore have high yields in mass production.

The present invention is directed to a DFB semiconductor laser with a diffraction grating which carrys out optical feedback, wherein this diffraction grating has, at the center of the laser cavity, a phase-shift structure of a half of the basic grating period which is the period averaged over the whole grating, and a section of period variation having grating periods different from the basic grating period is incorporated in the central region of the grating. This section of period variation is set in such a manner as the amounts of variation from the basic period spread from the phase-shift structure at the center towards both facets of the laser cavity with equal absolute values but the reversed sign to each other.

Further, the present invention relates to a DFB semiconductor laser with a diffraction grating which carrys out optical feedback, wherein this diffraction grating has, at the center of the laser cavity, a phase-shift structure of a half of the basic grating period which is the period averaged over the whole grating. A section without a grating is introduced into the central region of the cavity. On both sides of this section are incorporated sections of period variation having grating periods different from the basic grating period and these sections of period variation are set in such a manner as the amounts of variation from the basic period spread from the phase-shift structure at the center towards both facets of the laser cavity with equal absolute values but the reversed sign to each other.

Further, the present invention relates to a DFB semiconductor laser with a diffraction grating which carries out optical feedback, wherein this diffraction grating has, at the center of the laser cavity, a phase-shift structure of a half period, and a section without a grating is introduced into the central region of the cavity and on both sides of this section each portion of grating with an equal periods set symmetrically towards each facet of the laser cavity with respect to the phase-shift structure at the center.

BRIEF DESCRIPTION OF THE DRAWINGS

FIG. 4 shows intensity distribution profiles of electric field within the semiconductor laser device in accordance with the first embodiment (A), the second embodiment (B) and the third embodiment (C) of the present invention, as well as the intensity distribution profile of electric field within a conventional λ/4 phase-shifted DFB laser(D).

Figure 1A:
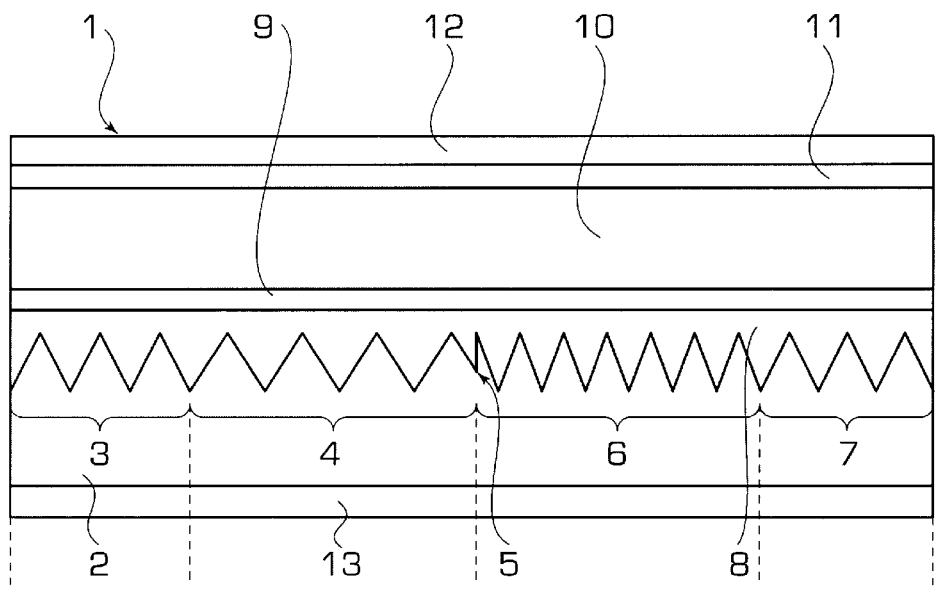
FIG. 1(A) is a cross-sectional view of a semiconductor laser device in accordance with a first embodiment of the present invention.

Explanation of symbols:
1,21,31 . . . Semiconductor laser
2 . . . N-type InP semiconductor substrate
3 . . . First diffraction grating
4 . . . Second diffraction grating
5 . . . Phase-shift structure
6 . . . Third diffraction grating
7 . . . Fourth diffraction grating
8 . . . N-type InGaAsP waveguide layer
9 . . . Multiple quantum well active layer
10 . . . P-type InP clad layer
11 . . . P-type InP cap layer
12 . . . P-type electrode
13 . . . N-type electrode
23 . . . First diffraction grating
24 . . . Second diffraction grating
25 . . . Phase-shift structure
26 . . . Third diffraction grating
27 . . . Fourth diffraction grating
33 . . . First diffraction grating
34 . . . Second diffraction grating
35 . . . Phase-shift structure
43 . . . First diffraction grating
44 . . . Second diffraction grating
45 . . . Phase-shift structure
53 . . . First diffraction grating
54 . . . Second diffraction grating
55 . . . Third diffraction grating

DETAILED DESCRIPTION OF THE INVENTION

In the conventional λ/4 phase-shifted DFB semiconductor lasers, as mentioned above, optical feedback becomes excessively strong near the center of the device so that light gathers in the central region. In the present invention, the amount of optical feedback from the grating near the center is reduced, by changing the grating period in the central region to a period which differs from the original basic period. However, a mere introduction of the change in the grating period is not enough because it acts as an equivalent of an additional phase-shift structure. Therefore, the grating period is set in such a manner as the amounts of variation from the basic period spread from the center of laser cavity towards both facets (ie. cavity ends) of the cavity with equal absolute value but the reversed sign to each other.

In this instance, whether the grating period is set longer or shorter than the original period, if the amount of variation is the same, optical feedback is decreased by an equal amount in both cases so that the amount of optical feedback near the center can be reduced. At the same time, since the sign is reversed towards both facets with respect to the cavity center, the grating period averaged over the whole grating is equal to the basic period and opposite phase-shifted structures are fabricated forwards and backwards, which cancels out unnecessary phase shifts.

Further, in this structure, as the distribution of the amount of optical feedback is symmetric between the front and the back with respect to the cavity center, the internal intensity distribution of electric field is symmetric between the front and the back with respect to the cavity center.

Consequently, in the present invention, the electric field does not form a peak near the center and the intensity distribution of electric field within the cavity can be flattened.

Further, similar to the conventional α/4 phase-shifted DFB semiconductor lasers, the laser of the present invention also oscillates at the Bragg wavelength which is determined by the average grating period over the whole cavity. When the main mode of the laser is equal to the Bragg wavelength, the difference between the main mode and side modes is the maximum. Hence, the threshold gain difference which is the indicator of the mode stability obtained in this structure can be as high as that in λ/4 phase-shifted DFB semiconductor lasers.

FIG. 1 shows one example of embodiment of the present invention. The laser in accordance with the present invention has a phase-shift structure 5 of a half of the basic grating period at the center. In this embodiment, the grating comprises a first grating 3, a second grating 4, a third grating 6 and a fourth grating 7. The second grating 4 and the third grating 6 constitute a section of period variation which has grating periods different from the basic period. These are incorporated in the central region of the whole grating in such a manner that the amounts of variation of both gratings from the basic period spread from the phase-shift structure as the center towards both facets of the cavity with equal absolute values but the reversed sign to each other. The first grating 3 and the fourth grating 7 have periods equal to the basic period, and located near the facets of the laser cavity.

Figure 1B:
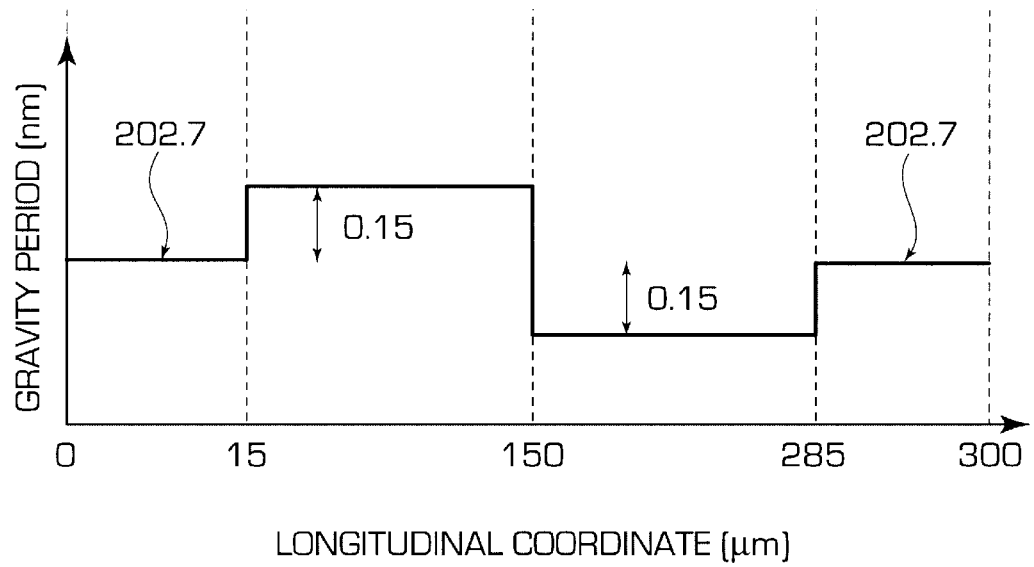
FIG. 1(B) shows the grating period distribution profile thereof.

In this embodiment, as shown in FIG. 1(B), the absolute value of the amounts of variation from the basic period is constant over the whole section of period variation, that is the entire second grating 4 as well as the entire third grating 6.

Figure 7:
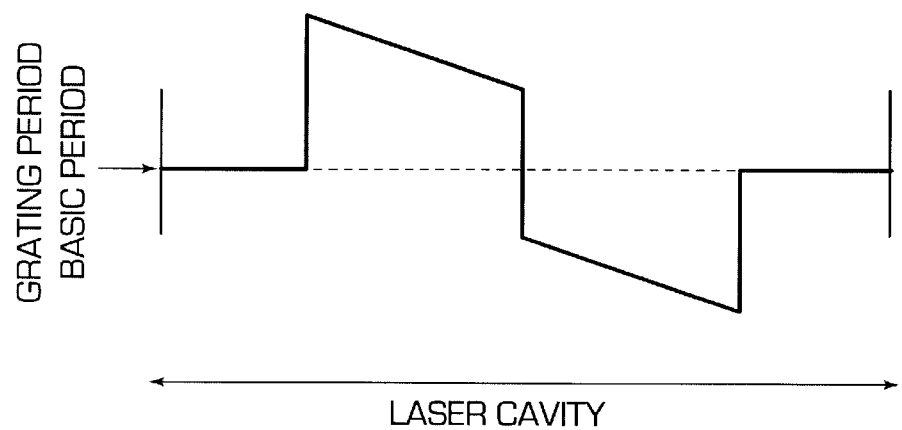
FIG. 7 shows the grating period profile of an embodiment regarding the present invention.

On the other hand, as shown in FIG. 7, the absolute value of the amounts of variation from the basic period in the section of period variation may be set to enlarge the difference from the basic period gradually from the center of the laser cavity towards the facets.

Further, as shown in FIG. 2, the absolute value of the amounts of variation from the basic grating period in the section of period variation may be set to enlarge the difference from the basic period gradually, satisfying the following equation (1) from the center of the laser cavity towards the facets.

$$\Lambda(z) = \Lambda_0 + \frac{\Lambda_0^2}{\pi}\left(\frac{1 + 4(z/L(1-z/L)(\kappa L)^2 - (1/2-z/L)^2)}{8cz(1-z/L)(1/2-z/L)}\right) \quad \text{Eq. (1)}$$

$$c = \sqrt{\frac{z/L(1-z/L)(\kappa L)^2}{(1/2-z/L)^2} - 1}$$

(where Z is the distance along the cavity axis, $\Lambda(Z)$ is the grating period, $\Lambda_0$ is the basic period and L is the cavity length.)

Setting grating periods to have the gradually enlarging variation from the basic grating period averaged over the whole cavity from the cavity center towards the facets in this way can flatten the electric field intensity distribution completely and, hence, increase the threshold gain difference.

Figure 8:
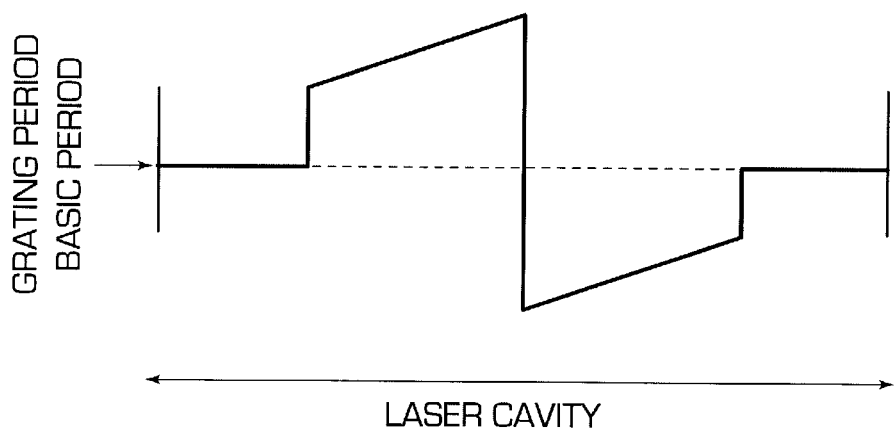
FIG. 8 shows the grating period profile of another example regarding the present invention.

Further, as shown in FIG. 8, the absolute value of the amounts of variation from the basic grating period in the section of period variation may be set to reduce the difference from the basic period gradually from the center of the laser cavity towards the facets.

In the above embodiment, the grating periods near the facets of the laser cavity are set equal to the basic period, which makes the optical feedback from the regions near the facets relatively greater and, therefore, flattens the electric field intensity distribution within the cavity still further.

Figure 9:
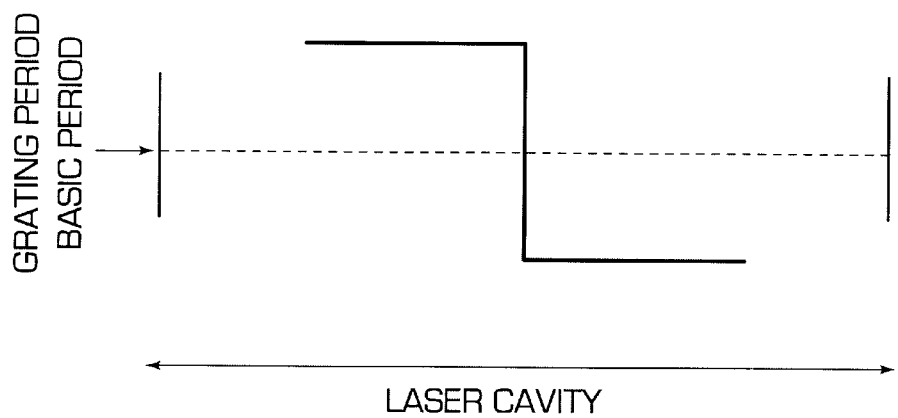
FIG. 9 shows the grating period profile of another example regarding the present invention.

On the other hand, in the present invention, as shown in FIG. 3 and FIG. 9, no grating may be set near the facets of the laser cavity, which lessens the effects by the facets (ie. end face of the cavity) and thereby reduces fluctuations of characteristics among elements in mass production.

Further, DFB coupling constants of gratings in the end sections of the laser cavity may be set to be larger than DFB coupling constants of gratings in sections located nearer to the center than these end sections, which makes the optical feedback from the regions near the facets relatively greater and, hence, flattens the electric field intensity distribution within the cavity.

Figure 10:
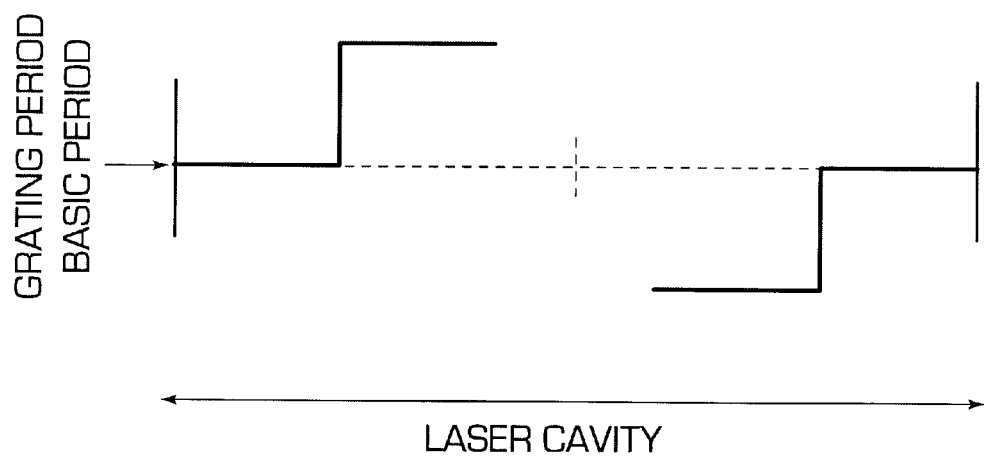
FIG. 10 shows the grating period profile example regarding the present invention.

Further, in another embodiment of the present invention, as shown in FIG. 10, a section without a grating may be introduced into the central region of the cavity, wherein gratings on both sides of this section in the cavity are set to create a phase shift of a half of the basic period at the center of the cavity. For example, with a structure shown in FIG. 1(A), this can be realized by replacing the grating portions of the equal length on both sides from the central phase-shift structure 5 with planar sections. In the present application, even in such a structure as having no grating in the central region of the cavity, as long as gratings located near laser facets are arranged to have a phase shift of a half period to each other, it is defined that there is a phase-shift structure at the center. This completely wipes out the optical feedback at the center of the cavity and flattens the electric field intensity distribution within the cavity.

Not only for the embodiment shown in FIG. 10, but for embodiment in which the sections of period variation are set to in the central region of the grating as described above, a central portion of the grating may be replaced with a planar section.

Figure 11:
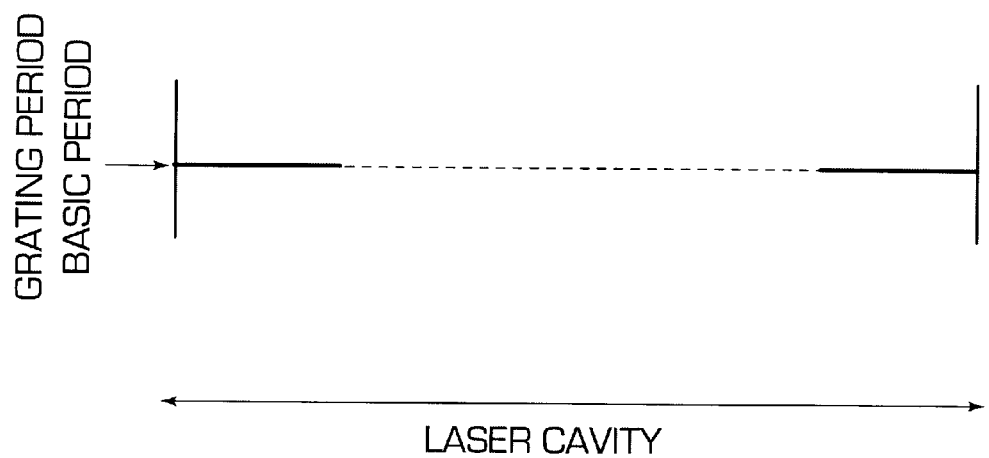
FIG. 11 shows the grating period profile example regarding the present invention.

Further, in the present invention, as shown in FIG. 11, introducing a section without a grating into the central region of the cavity and setting gratings with the same period on both sides of this section can also wipe out the optical feedback at the center of the cavity and flatten the electric field intensity distribution within the cavity. In this case, gratings on both sides of the cavity are set to create a phase shift of a half of the basic period at the center of the cavity.

Therefore, in accordance with the present invention, only by changing the grating periods, it can be realized to produce a laser which is high in a single-mode quality, has the flat electric field intensity distribution within the laser cavity and shows small wavelength shifts at the time of modulation.

First Embodiment

FIG. 1(A) is a schematic view of structure of a semiconductor laser 1 with cavity width of 300 µm, showing the first embodiment of the present invention.

Concerning to fabrication of this semiconductor laser, a first grating 3, a second grating 4, a third grating 6 and a fourth grating 7 are, first fabricated on an N-type InP semiconductor substrate 2 by a known method of electron beam exposure and a known method of lithography, wherein a phase-shift structure 5 is set to be fabricated between the second grating 4 and the third grating 6. The depth of etching for the fabrication of the first grating 3, the second grating 4, the third grating 6 and the fourth grating 7 is 0.03 µm so as to set the DFB coupling constant κ to be approximately 70 cm$^{-1}$.

Upon this, by a known method of epitaxial growth, an N-type InGaAsP waveguide layer 8 with thickness of 0.1 µm, a multiple quantum well active layer 9 with thickness of 0.2 µm, a P-type InP clad layer 10 with thickness of 3µm, a P-type InP cap layer 11 with thickness of 0.2 µm are fabricated, respectively. Next by a known method of electrode fabrication, a P-type electrode 12 is set on the P-type InGaAsP cap layer 11 and an N-type electrode 13 is set under the N-type InP semiconductor substrate 2. Further, antireflection coating is applied on both facets of the semiconductor layer 1.

As period distribution profile of the first grating 3, the second grating 4, the third grating 6 and the fourth grating 7 of this case is shown in FIG. 1(B), the first grating 3 has a period of 202.7 nm and a length of 15 µm from one facet, the second grating 4 has a period of 202.85 nm and a length of 135 µm, the third grating 6 has a period of 202.55 nm and a length of 135 µm and the fourth grating 7 has a period of 202.7 nm and a length of 15 µm. Further, the first grating 3 and the second grating 4 are fabricated to have the continuous phase. Between the second grating 4 and the third grating 6, a structure (a phase-shift structure 5) by which the phase is shifted by a half of the grating period averaged over the first to the fourth gratings is incorporated. The third grating 6 and the fourth grating 7 are also fabricated to have the continuous phase.

A curve (A) in FIG. 4 shows the intensity distribution of electric field within this semiconductor laser 1. The ratio of the minimum value to the maximum value of the internal electric field intensity for this laser is 0.73, which is larger than the ratio for the conventional λ/4 phase-shifted DFB laser, 0.33, as shown by a curve (D) in FIG. 4 and thereby illustrates that the intensity distribution of internal electric field of the present embodiment is flattened.

Further, with respect to the threshold gain difference, an indicator of the laser mode stability, the semiconductor laser of this structure attains the value of 0.61, higher than the level suitable for practical purpose, which is equal to or more than 0.5.

Further, in the present embodiment, the oscillation wavelength of laser is 1.3 µm which is the Bragg wavelength determined by the average grating period of the first grating 3, the second grating 4, the third grating 6 and the fourth grating 7.

Further, while the length of laser cavity is set to be 300 μm in the present embodiment the present invention is not limited to this value.

Further, although, in the present embodiment, the normalized coupling constant κ×L is set to be approximately 2 where L is the laser cavity length (DFB coupling constant κ for the first to the fourth grating 3–7 is set to be approximately 70 cm$^{-1}$), 2 to 4 is generally preferred. As the normalized coupling constant is set to be large, it becomes necessary to reduce the amount of optical distributed feedback near the cavity center, which leads to an increase in period of the second grating 4 as well as a decrease in period of the third grating 6 by the same amount. The larger the normalized coupling constant is set the more stable the lasing mode becomes, and even if a laser device obtained after the cleavage has a first grating 3 and a fourth grating 7 with lengths differing from the designed ones, their effects can be kept small.

Second Embodiment

Figure 2A:
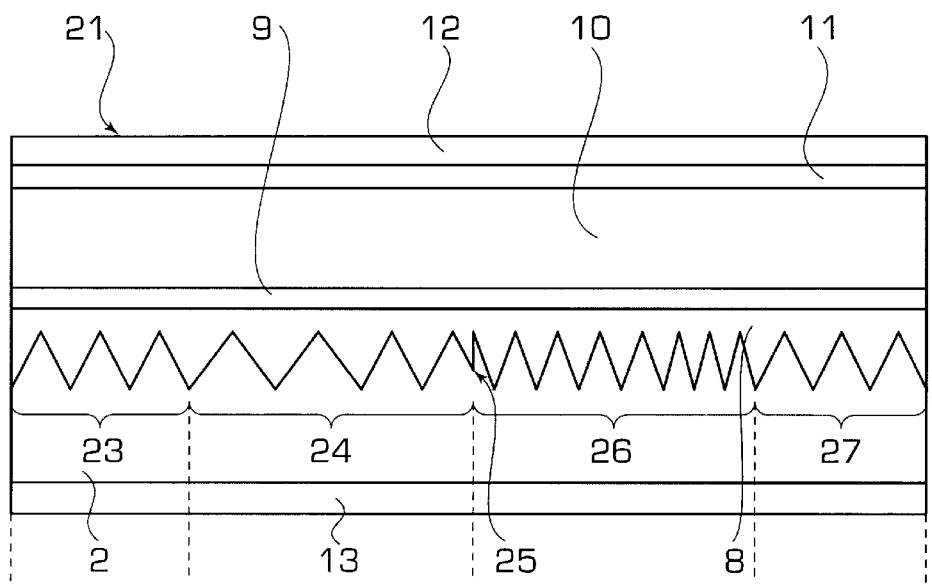
FIG. 2(A) is a cross-sectional view of a semiconductor laser device in accordance with a second embodiment of the present invention.

FIG. 2(A) is a schematic view of structure of a semiconductor laser 21, showing the second embodiment of the present invention. Apart from periods of gratings thereof, this structure is the same as the first embodiment and can be fabricated in the same way.

Figure 2B:
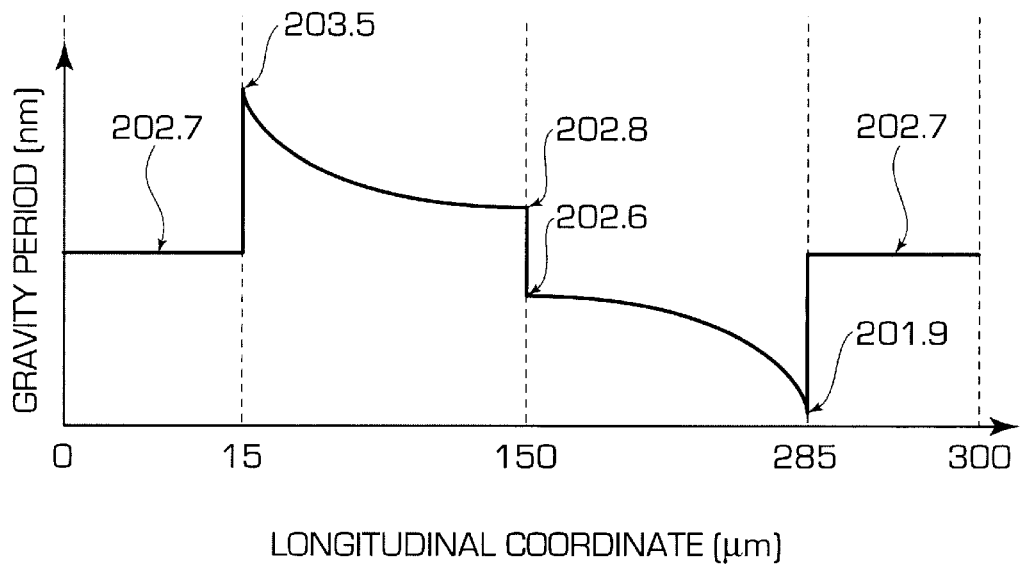
FIG. 2(B) shows the grating period distribution profile thereof.

As the period distribution profile of a first grating 23, a second grating 24, a third grating 26 and a fourth grating 27 of this case is shown in FIG. 2(B), the first grating 23 has a period of 202.7 nm and a length of 15 μm from one facet. The second grating 24 is to be fabricated to have a period of Λ(Z) which is given by the above Equation (1) when the cavity length L=300 μm the average period Λo=0.2027 μm and the normalized coupling constant κL=2, and length of 135 μm. The phase between the first grating 23 and the second grating 24 is fabricated to be continuous.

The third grating 26 also has a period given by Equation (1) and a length of 135 μm between the second grating 24 and the third grating 26, a structure (a phase-shift structure 25) by which the phase is shifted by a half of the grating period averaged over the first to the fourth gratings is incorporated. The fourth grating 27 has a period of 202.7 nm and a length of 15 μm and between the third grating 26 and the fourth grating 27 the continuous phase is fabricated.

A curve (B) in FIG. 4 shows the intensity distribution of electric field within this semiconductor laser 21. The ratio of the minimum value to the maximum value of the internal electric field intensity for this laser is 0.83, which is larger than the ratio for the conventional λ/4 phase-shifted DFB laser 0.33, as shown by a curve (D) in FIG. 4 and thereby illustrates that the intensity distribution of electric field for this embodiment is flattened.

Further, with respect to the threshold gain difference which indicates the laser mode stability, the semiconductor laser of this structure attains the value of 0.78. This is higher than 0.77 of the conventional λ/4 phase-shifted DFB laser.

Further, in the present embodiment, the oscillation wavelength of laser is 1.3 μm which is the Bragg wavelength determined by the average grating period of all the gratings in the device.

Further, while the length if the laser cavity is set to be 300 μm in the present embodiment, the present invention is not limited to this value.

Further, although, in the present embodiment, the normalized coupling constant κ×L is set to be approximately 2 where L is the laser cavity length (DFB coupling constant κ for the first to the fourth grating 23–27 is set to be approximately 70 cm$^{-1}$), 2 to 4 is generally preferred. As the normalized coupling constant is set to be larger, periods of the second grating 24 and the third grating 26, both of which are obtained from Equation (1), have greater difference from the basic period over the whole sections. Moreover the lengths of the second grating 24 and the third grating 26 increase while the lengths of the first grating 23 and the fourth grating 27 decrease (the sum of the lengths is kept constant). Thus, the lasing mode becomes more stable and even if a laser device obtained after the cleavage has a first grating 23 and a fourth grating 27 with lengths differing from the designed ones, their effects can be kept small.

Further, DFB coupling constant κ of the first grating 23 and the fourth grating 27 can be set to be, for example, 100 cm$^{-1}$, a higher value than DFB coupling constant of the second grating 24 and the third grating 26. In this case, the amount of distributed feedback from the gratings near the facets becomes relatively greater and, hence, the electric field intensity distribution within the cavity can be flattened still further.

Third Embodiment

Figure 3A:
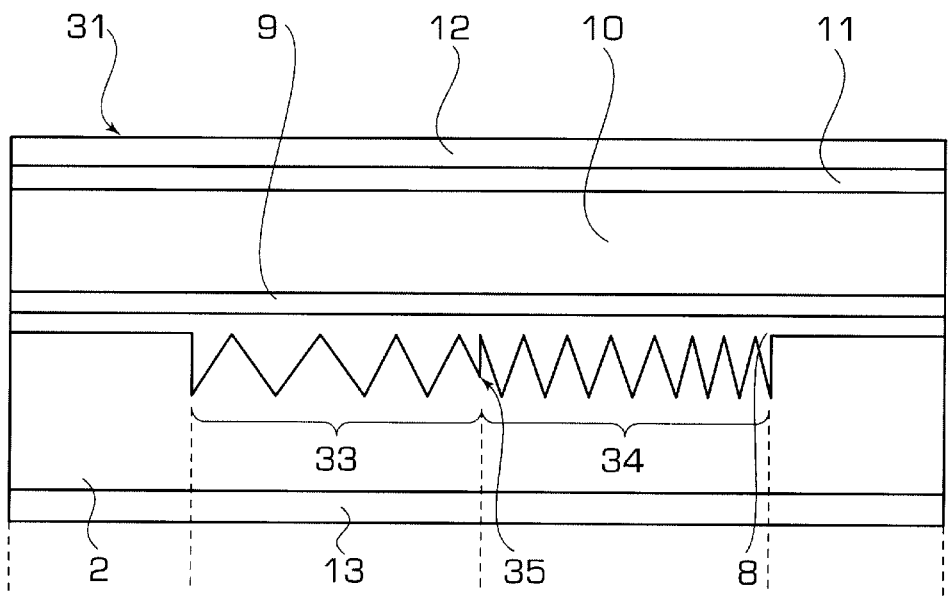
FIG. 3(A) is a cross-sectional view of a semiconductor laser device in accordance with a third embodiment of the present invention.

FIG. 3(A) is a schematic view of structure of a semiconductor laser 31, showing the third embodiment of the present invention. In this structure, the diffraction grating comprises a first grating 33 and a second grating 34 and can be fabricated in the same way as the first embodiment. The depth of etching for the fabrication of the first grating 33 and the second grating 34 is 0.033 μm so as to set DFB coupling constant, κ to be approximately 75 cm$^{-1}$.

Figure 3B:
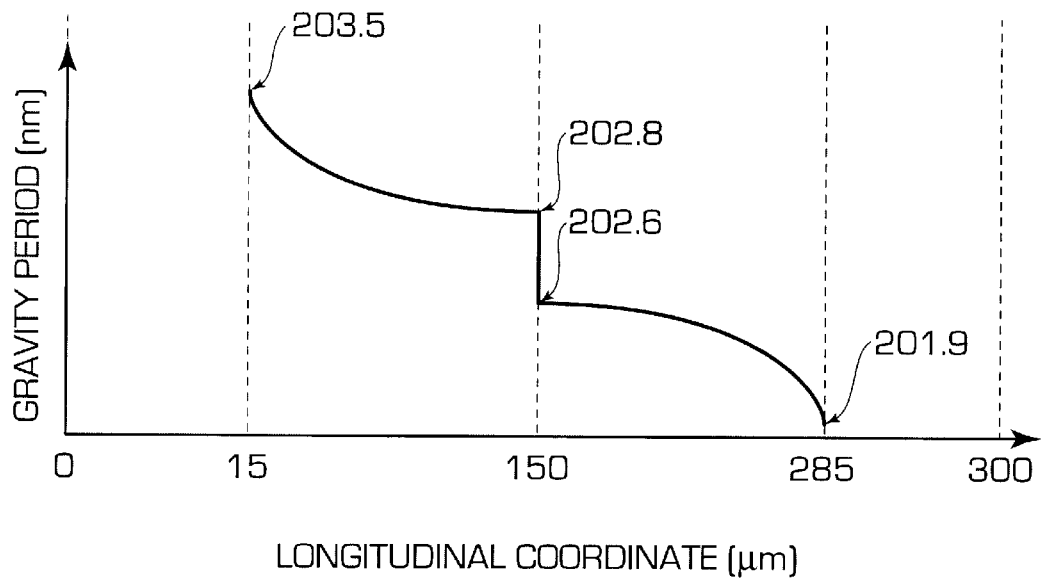
FIG. 3(B) shows the grating period distribution profile thereof.
Figure 5:
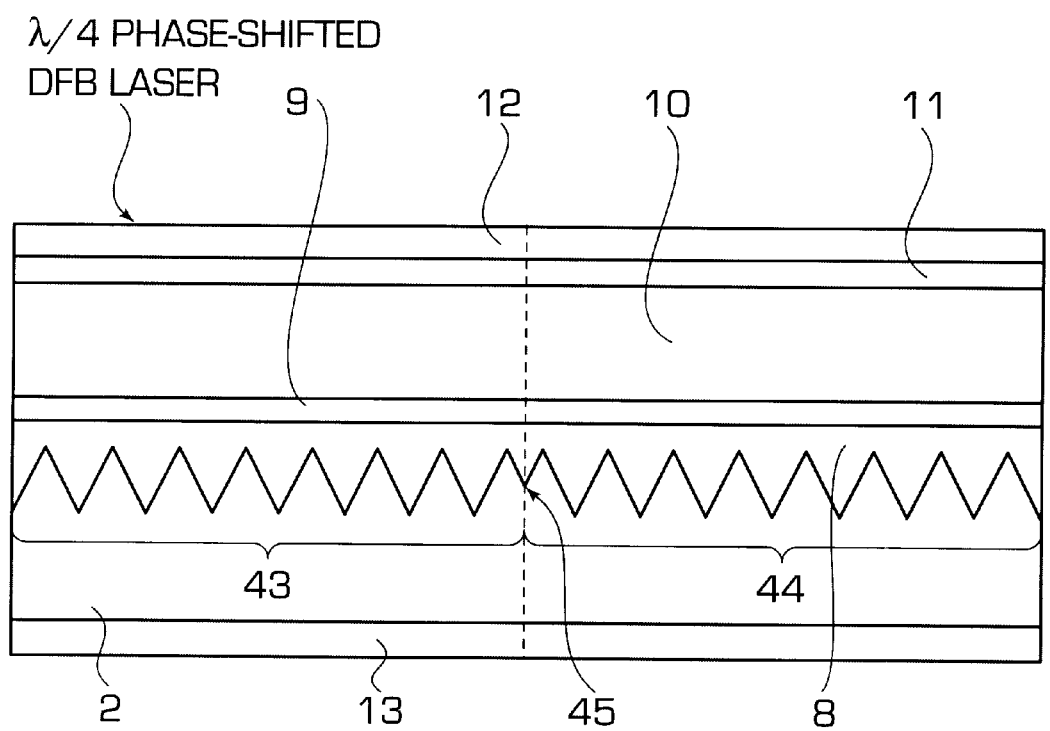
FIG. 5 is a cross-sectional view of a first example of the conventional λ/4 phase-shifted DFB laser.

The period distribution profile of the first grating 33 and the second grating 34 of this case is shown in FIG. 3(B). The first grating 33 is fabricated to have a period given by the above Equation (1) and a length of 135 μm from the point at a distance of 15 μm from one facet. The second grating 34 is also fabricated to have a period given by the above Equation (1) and a length of 135 μm. Between the first grating 33 and the second grating 34, a structure is incorporated (a phase-shift structure 35) by which the phase is shifted by a half of the grating period averaged over the first grating 33 and the second grating 34.

A curve (C) in FIG. 4 shows the intensity distribution of electric field within this semiconductor laser 31. The ratio of the minimum value to the maximum value of the internal electric field intensity for this laser is 0.73, which is larger than the ratio for the conventional λ/4 phase-shifted DFB laser 0.33, as shown by a curve (D) in FIG. 4 and thereby illustrates that the intensity distribution of internal electric field is flattened.

Further, with respect to the threshold gain difference which indicates the single mode quality, the semiconductor laser of this structure attains the value of 0.99. This is higher than 0.77 of the conventional λ/4 phase-shifted DFB laser.

Further, in the present embodiment, the oscillation wavelength of laser is 1.3 μm which is the Bragg wavelength determined by the average grating period of all the gratings in the device.

Further, while the length of the laser cavity is set to be 300 μm and the length of the grating placed therein is 270 μm in the present embodiment, the present invention is not limited to this value.

Further, although, in the present embodiment, the normalized coupling constant κ×L is set to be approximately 2 where the length of the grating placed in the device is 270 μm (DFB coupling constant κ for the first and the second grating 33, 34 is set to be approximately 75 cm$^{-1}$), 2 to 4 is generally preferred. As the normalized coupling constant is set to be larger, the lasing mode becomes more stable, owing to the same reason as the second embodiment, and even if a laser device obtained after the cleavage has a first grating 33 and a second grating 34 with lengths differing from the designed ones, effects thereof can be kept small.

According to the present invention, there can be provided a semiconductor laser which does not show the variation in the ratio of the forward to the backward lasing output power even when the bias current is altered, and which is easy to monitor the lasing output power on the system, by making the longitudinal intensity distribution of electric field in the laser cavity uniform. Further, by making the longitudinal intensity distribution of electric field in the laser cavity uniform, there can be provided a semiconductor laser which shows less wavelength shift at the time of modulation, is capable of a stable operation even at the time of modulation and has a high conversion efficiency (output light against input current).

Further, according to the present invention, there can be provided a semiconductor laser with reduced rates of code errors in digital modulation through raising the lasing mode stability, in comparison with the conventional semiconductor lasers.

Further, according to the present invention, there can be provided a semiconductor laser which may can show less fluctuation in characteristics among lasers and thereby achieve high yields in mass production.

The use of the semiconductor laser of the present invention, therefore, enables large capacity transmission in optical communication, leading to a wider communication service and a greater number of subscribers. Moreover, optical communication systems for subscribers with a low cost can be realized.

What is claimed is:

1. A DFB semiconductor laser with a diffraction grating which carries out optical feedback, comprising:

at the center of a laser cavity, a phase-shift structure of a half of a basic grating period which is a period averaged over the whole grating, and a section of grating with period variation having grating periods different from the basic grating period in the central region of the grating, wherein the section of period variation is set such that the amounts of variation from the basic period spread from the phase-shift structure at the center towards both facets of the laser cavity have equal absolute values but a reversed sign to each other.

2. The DFB semiconductor laser according to claim 1, wherein the absolute value of the amounts of variation from the basic grating period in the section of period variation is constant over the whole section of period variation but the sign thereof is reversed at the center of the laser cavity.

3. The DFB semiconductor laser according to claim 1, wherein the absolute value of the amounts of variation from the basic grating period in the section of period variation is set to enlarge the difference from the basic period gradually from the center of the laser cavity towards the facets and the sign thereof is reversed at the center of laser cavity.

4. The DFB semiconductor laser according to claim 3, wherein the absolute value of variation from the basic grating period in the section of period variation is set to enlarge the difference from the basic period gradually, satisfying the following Equation (1), from the center of the laser cavity towards the facets and the sign thereof is reversed at the center of the laser cavity, $$\Lambda(z) = \Lambda_0 + \frac{\Lambda_0^2}{\pi}\left(\frac{1 + 4(z/L(1-z/L)(\kappa L)^2 - (1/2-z/L)^2)}{8cz(1-z/L)(1/2-z/L)}\right) \quad \text{Eq. (1)}$$

$$c = \sqrt{\frac{z/L(1-z/L)(\kappa L)^2}{(1/2-z/L)^2} - 1}$$

(where Z is the distance along the cavity axis, $\Lambda(Z)$ is the grating period, $\Lambda_o$ is the basic period and L is the cavity length).

5. The DFB semiconductor laser according to claim 1, wherein the grating period in the regions near laser cavity facets is equal to the basic period.

6. The DFB semiconductor laser according to claim 1, wherein no grating is placed in the regions near the laser cavity facets.

7. The DFB semiconductor laser according to claim 1, wherein DFB coupling constant of the gratings in the end regions of the laser cavity is set to be larger than DFB coupling constant of the gratings in the regions nearer to the center than the end regions.

8. The DFB semiconductor laser according to claim 1, wherein:

the grating comprises a first grating, a second grating, a third grating and a fourth grating, which are placed from one facet to the other facet in the laser cavity, and the boundary between the second grating and the third grating is situated at the center of the cavity, with a phase shift of a half of the basic grating period being set thereon, and the second grating and the third grating have an equal length along the laser cavity axis and respective grating periods and the amounts of variation as against the basic period thereof are set to spread from the center of the laser cavity towards both facets of the laser cavity with equal absolute values but the reversed sign to each other, and the grating periods of the first grating and the fourth grating are equal to the basic grating period.

9. The DFB semiconductor laser according to claim 8 wherein the absolute value of the amounts of variation from the basic period for the second grating and the third grating is constant over the whole second grating and the whole third grating.

10. The DFB semiconductor laser according to claim 8, wherein the absolute value of the amounts of variation from the basic period for the second grating and the third grating is set to enlarge the difference from the basic period gradually from the center of the laser cavity towards the facets.

11. The DFB semiconductor laser according to claim 10, wherein the absolute value of the amounts of variation from the basic period for the second grating and the third grating is set to enlarge the difference from the basic period gradually, satisfying the Equation (1), from the center of the laser cavity towards the facets.

12. The DFB semiconductor laser according to claim 1, wherein:

the grating comprises a first grating and a second grating, which are placed from one facet to the other facet in the laser cavity, and the boundary between the first grating and the second grating is situated at the center of the cavity, with a phase shift of a half of the basic grating period being set thereon, and the first grating and the second grating have an equal length along the laser cavity axis and respective grating periods and the amounts of variation as against the basic period thereof are set to spread, with equal absolute values but the reversed sign to each other, enlarging the difference from the basic period gradually, by satisfying the Equation (1), from the center of the laser cavity towards the both facets.

13. A DFB semiconductor laser with a diffraction grating which carries out optical feedback, comprising:

a section without a grating at the central region of a laser cavity, and on both sides of the section without a grating are sections of grating of period variation having grating periods different from a basic grating period, wherein:

the basic grating period is a period averaged over the whole grating, said sections of grating of period variation are phase shifted, relative to each other, by a half the basic grating period, and the sections of period variation are set such that the amounts of variation from the basic period spread from the center of the laser cavity towards both facets of the laser cavity have equal absolute values but a reversed sign to each other.

14. The DFB semiconductor laser according to claim 13, wherein the absolute value of the amounts of variation from the basic grating period in the sections of period variation is constant over the whole section of period variation but, the sign thereof is reversed at the center of the laser cavity.

15. The DFB semiconductor laser according to claim 13, wherein the absolute value of the amounts of variation from the basic grating period in the sections of period variation is set to enlarge the difference from the basic period gradually from the center of the laser cavity towards the facets and the sign thereof is reversed at the center of the laser cavity.

16. The DFB semiconductor laser according to claim 15, wherein the absolute value of variation from the basic grating period in the sections of period variation is set to enlarge the difference from the basic period gradually, satisfying the Equation (1), from the center of the laser cavity towards the facets and the sign thereof is reversed at the center of the laser cavity.

17. The DFB semiconductor laser according to claim 13, wherein the grating period in the regions near laser cavity facets is equal to the basic period.

18. The DFB semiconductor laser according to claim 13, wherein no grating is placed in the regions near the laser cavity facets.

19. The DFB semiconductor laser according to claim 13, wherein DFB coupling constant of the gratings in the end regions of the laser cavity is set to be larger than DFB coupling constant of the gratings in the regions nearer to the center than the end regions.

* * * * *

UNITED STATES PATENT AND TRADEMARK OFFICE
CERTIFICATE OF CORRECTION

PATENT NO. : 6,175,581 B1
DATED : January 16, 2001
INVENTOR(S) : Kenji Sato

Page 1 of 1

It is certified that error appears in the above-identified patent and that said Letters Patent is hereby corrected as shown below:

Column 1,
Line 29, delete "$\lambda_B 3 2 \Lambda n_{eff}$" insert -- $\lambda_B = 2\Lambda n_{eff}$ --

Column 2,
Line 26, delete "carrys" insert -- carries --

Figure 6A:
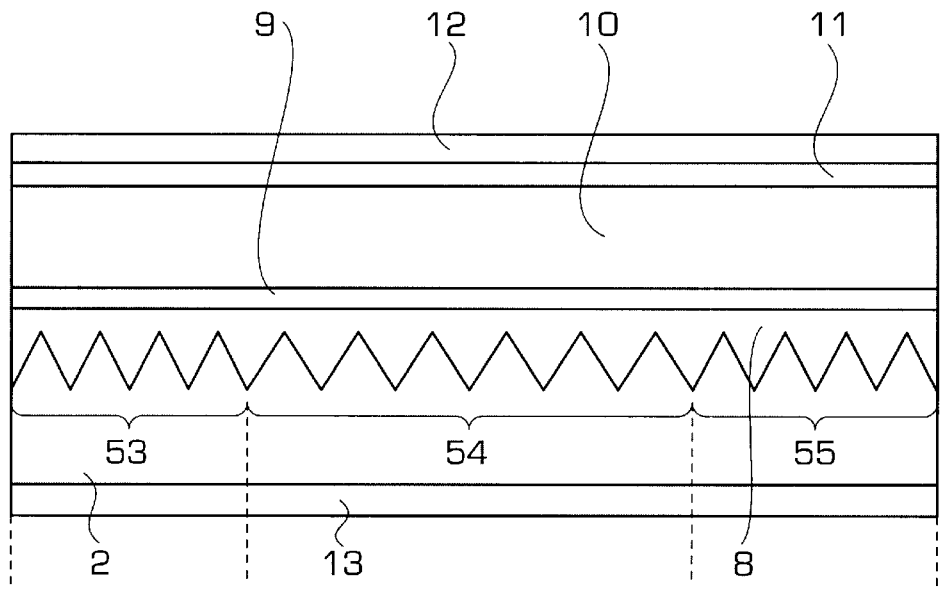
FIG. 6A–6B are a cross-sectional view of a second example of the conventional semiconductor laser device.
Figure 6B:
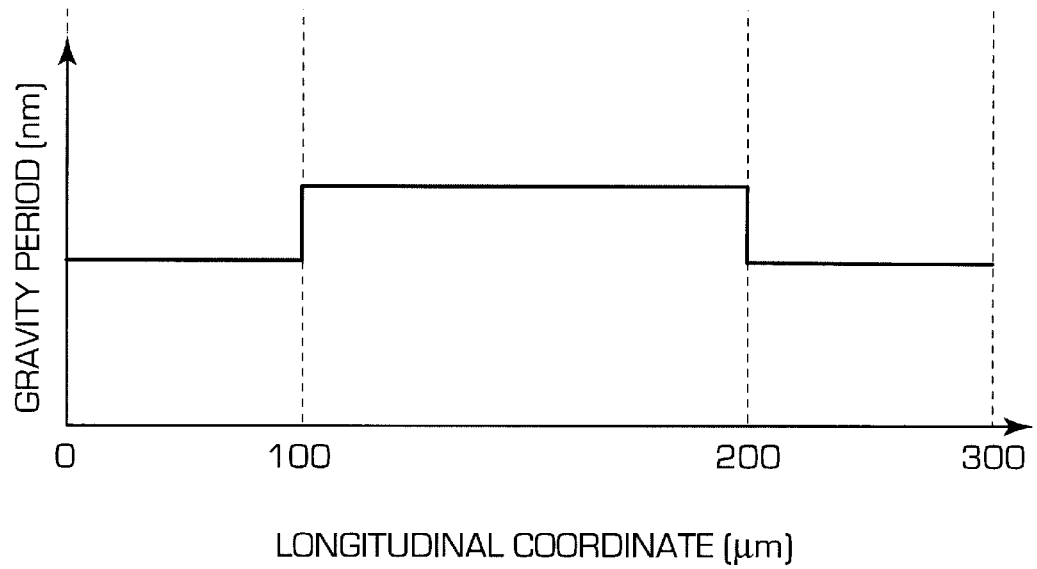

Column 3,
Line 20, delete "Fig. 6A-6B" insert -- Fig. 6 --

Signed and Sealed this

Eleventh Day of December, 2001

Attest:

NICHOLAS P. GODICI
Attesting Officer
Acting Director of the United States Patent and Trademark Office